(12) United States Patent
Taylor et al.

(10) Patent No.: US 6,592,018 B2
(45) Date of Patent: Jul. 15, 2003

(54) SEALANT AGAINST POTTING COMPOUND

(75) Inventors: Russell Taylor, Southampton (GB); Tom Copeland, Kidsgrove (GB)

(73) Assignee: Siemens Aktiengesellschaft, Munich (DE)

(*) Notice: Subject to any disclaimer, the term of this patent is extended or adjusted under 35 U.S.C. 154(b) by 53 days.

(21) Appl. No.: 09/968,630

(22) Filed: Oct. 2, 2001

(65) Prior Publication Data
US 2002/0043549 A1 Apr. 18, 2002

(30) Foreign Application Priority Data
Oct. 2, 2000 (EP) ............................................ 00308655

(51) Int. Cl.⁷ ................................................ H05K 3/34
(52) U.S. Cl. .................. 228/179.1; 228/214; 228/248.1
(58) Field of Search ............................ 228/179.1, 214, 228/248.1, 180.1, 180.21, 215, 260, 256

(56) References Cited

U.S. PATENT DOCUMENTS

| | | | |
|---|---|---|---|
| 3,885,304 A | 5/1975 | Kaiser et al. | 29/627 |
| 4,238,186 A * | 12/1980 | Pfahl, Jr. | 432/10 |
| 5,102,712 A | 4/1992 | Peirce et al. | 428/76 |
| 5,400,948 A * | 3/1995 | Sajja et al. | 228/180.1 |
| 5,400,953 A * | 3/1995 | Maeno | 228/248.1 |
| 5,435,733 A | 7/1995 | Chernicky et al. | 439/68 |
| 5,535,936 A | 7/1996 | Chong et al. | 228/175 |
| 6,310,298 B1 * | 10/2001 | Barrett et al. | 174/250 |

* cited by examiner

Primary Examiner—M. Alexandra Elve
Assistant Examiner—Len Tran
(74) Attorney, Agent, or Firm—Crowell & Moring LLP

(57) ABSTRACT

The present method relates to the use of a peelable anti-solder mask as a sealant against potting compound. In certain electrical apparatus, a modular component (300) must be attached to a side of a printed circuit board (PCB) (110) which has previously been exposed to solder. Solder 'pick up' is prevented by application of a removable mask (202) over areas of the exposed side of the PCB (110) which will receive the modular component (300). Potting compound is used to protect components of electrical circuits (108) from vibration, moisture and static discharges. The anti-solder mask (202) can be used as a thin gasket to prevent the ingress of potting compound between the modular component (300) and the PCB (110).

6 Claims, 2 Drawing Sheets

SEALANT AGAINST POTTING COMPOUND

FIELD OF THE INVENTION

The present invention relates to the use of a peelable mask as a sealant against potting compound.

BACKGROUND TO THE INVENTION

When soldering a printed circuit board (PCB) in a flow solder machine or a solder bath, solder adheres to any exposed metal surfaces it comes in contact with.

Commonly, a peelable solder-repellent mask is used to prevent unwanted solder adherence, also known as solder "pick up". The peelable solder mask is arranged to cover areas of exposed metal where solder adherence would be undesirable for manufacturing or safety reasons and as the name suggests this mask can then be pealed away to reveal unsoldered metal areas. Materials used as solder masks include epoxy and acrylate compounds.

Manufacture of electronic devices often involves a plurality of assembly stages, including one or more soldering stages. In the manufacture of electronics whose components are attached to a PCB from both sides, it is desirable that the components for a first side of the PCB be soldered in place before components for a second side are attached. Soldering components to the first side of the PCB means exposing the second side to solder. The second side may also be provided with metal contacts to which components have yet to be attached, for example pressure contacts for components which will be mechanically attached to the second side after soldering. A peelable mask may be used to prevent solder pick up on these metal contacts. The metal contacts on the second side are masked while components are soldered to the first side then the mask is removed to allow components being attached to the second side of the PCB to make contact with the PCB itself.

One example of electronics where components are attached to a PCB from both sides is the electronics for an inverter for a COMBIMASTER [Registered Trademark] CM411 combined inverter and motor. It will be understood however that the following discussion relates not only to this specific example but to the attachment of electrical components to PCBs in general.

In many electrical devices, including inverters, physical factors can degrade the performance of electronics. Vibration, heat, humidity and proximity of components are all problems which afflict electronic circuits. To ameliorate these afflictions, it is advantageous to immerse electronic circuits in a potting compound, for example a urethane or epoxy resin. Potting compound reduces vibration of components and protects against impact and shock; protects against static discharge by having a low dielectric constant in comparison to air; excludes the ingress of moisture, dust particles and chemicals; has a higher heat conductivity than air, thus giving a steeper temperature gradient with distance from components; and for all these reasons, improves a circuit's tolerance of component proximity.

Alternatives to potting compounds have their concomitant drawbacks, conformal coating can be applied either by spraying or dipping. Conformal coating does exclude moisture but vibration is not reduced to the same extent as in potting compound and the thermal conductivity remains virtually unchanged over air. More conclusively, conformal coating is costly.

Potting compound, though desirable in some parts of an electronic device can impair the performance of other parts. To exclude potting compound from the latter parts, the electronic device is provided with mechanical seals or gaskets.

In the example of the electronics for an inverter, the assembly is further complicated by the requirement that one modular component must be held in place by compression, rather than soldering, between the modular component and a PCB. The modular component makes electrical contact to the PCB by means of compressible conductor legs. Not only is the modular component a component of the type that potting compound can render unusable but the introduction of a conventional gasket to prevent the ingress of potting compound renders the compressible conductor legs, and therefore the whole modular component, disabled.

OBJECT OF THE INVENTION

An object of the present invention seeks to seal the electrical connections of a modular electrical component (in terms of the example, a Semikron MiniSKiiP [RTM] Module) from the ingress of a potting compound when it is mechanically attached to a printed circuit board.

It is therefore an object of the invention to obviate or at least mitigate the aforementioned problems.

STATEMENT OF THE INVENTION

In accordance with one aspect of the present invention, there is provided a method for assembling an electrical device having a printed circuit board, the printed circuit board having a first side and a second side and being provided with slots for receiving conducting legs of at least one electrical component, the method including the steps of:

a) masking an area of the second side of the printed circuit board with a solder-repellent mask, the masked area comprising a first portion and a second portion;

b) disposing said at least one electrical component on the first side of the printed circuit board with the conducting legs extending through the slots from the first side to the second side;

c) fixing said at least one electrical component in place by exposing the second side of the printed circuit board to solder and allowing the solder to solidify;

the method characterised by further including the steps of:

d) removing the solder-repellent mask from the first portion to expose at least one contact while leaving the solder-repellent mask in place over the second portion; and e) disposing a further electrical component directly against the second side, a lower surface of the further electrical component lying adjacent to the second side, the second portion corresponding to at least those points of the masked area at which the lower surface of the further electrical component touch the masked area, the second portion thereby forming a seal between the further electrical component and the second side.

The method preferably further includes the step of:

f) submerging the electrical device in a potting compound, the second portion preventing the ingress of potting compound between the further electrical component and the printed circuit board.

The masked area may be a single contiguous area.

The second portion may be an outer portion of the masked area and the first portion, an inner portion of the masked area, such that all points on the periphery of the masked area lie within the second portion.

The exposure to solder in step c) is preferably achieved through a flow solder technique.

The further electrical component can be an inverter module.

In a further aspect of the present invention there is provided a peelable mask for masking a printed circuit board from solder pick up, when solder is applied to the printed circuit board and for sealing a gap between an electronic component and the printed circuit board from the ingress of a potting compound.

The peelable mask may cover a masked area having an inner portion and an outer portion, the mask covering the inner portion being removed subsequent to soldering.

Thus according to the present invention, a peelable mask can be used to protect an area of a printed circuit board (PCB) provided with contacts for a modular electrical component, for example a MiniSKiiP Module, from exposure to solder. Furthermore, at least part of the peelable mask can be used as a mechanical seal to stop the ingress of potting compound between the modular electrical component and the PCB.

BRIEF DESCRIPTION OF THE FIGURES

The invention may be understood more readily, and various other aspects and features of the invention may become apparent from consideration of the following description and the figures as shown in the accompanying drawing sheets, wherein.

DETAILED DESCRIPTION OF THE INVENTION

There will now be described, by way of example, the best mode contemplated by the inventors for carrying out the invention. In the following description, numerous specific details are set out in order to provide a complete understanding of the present invention. It will be apparent, however, to those skilled in the art, that the present invention may be put into practise with variations of this specific.

The following discussion relates to an embodiment of the present invention implemented in sealing a MiniSKiiP Module to a PCB in an inverter, for example the inverter part of the COMBIMASTER CM411 combined inverter and motor. Like reference signs refer to like features.

Figure 1:
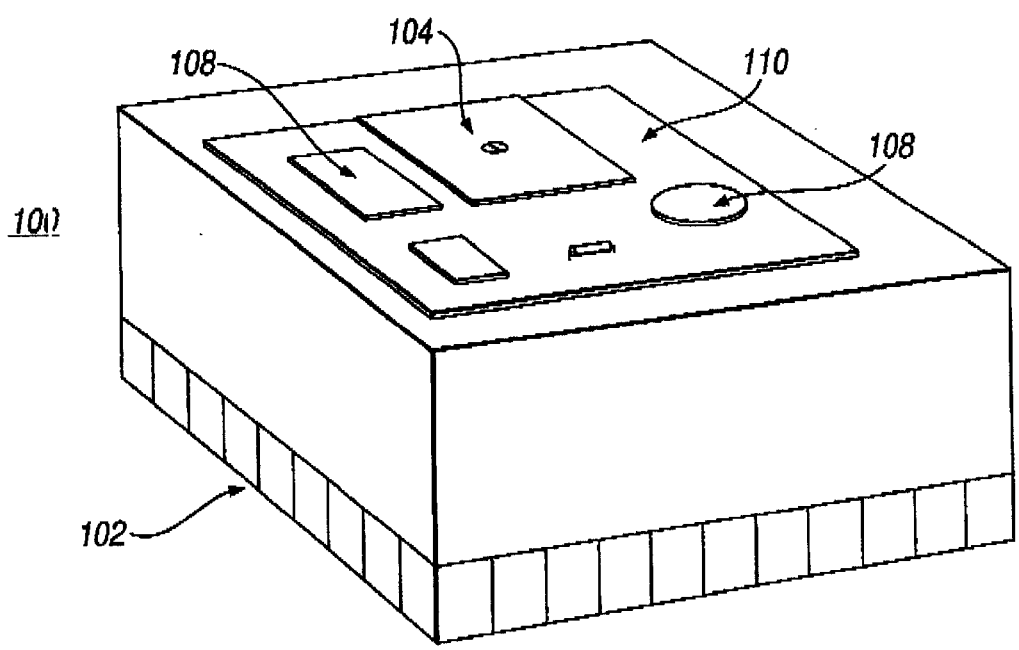
FIG. 1 shows a heat sink cover for an inverter.

FIG. 1 shows an arrangement 100 of inverter electronics mounted inside a heat sink cover 102, which in the case of the COMBIMASTER is fitted on top of the inverter housing (not shown) which in turn is mounted onto the motor (also not shown). The inverter electronics are disposed on a first side 110A of a printed circuit board (PCB) 110; the first side 110A being the upper side as seen in FIG. 1. Close to the centre of the first side 10A there is provided a MiniSKiiP cover 104, which serves to cover an area of the first side 110A opposite to a MiniSKiiP contact area (not shown) on a second side 110B of the PCB 110. Other electrical components 108 are provided on the first side 110A of the PCB 110.

Figure 2:
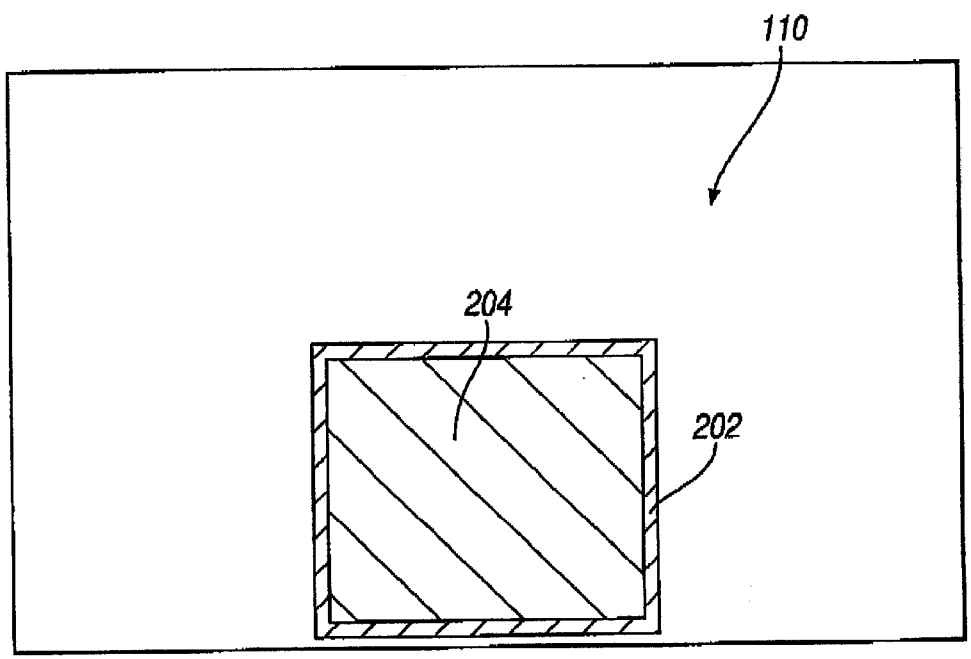
FIG. 2 shows the areas of a printed circuit board covered by a peelable mask in accordance with the present invention.

Peelable mask is laid in a pattern upon the second side 110B of the PCB 110 to cover an area 202,204, illustrated as the shaded area in FIG. 2. The mask is removed from an inner portion 204 of the shaded area 202,204 immediately after the PCB 110 is exposed to solder, for example flow soldering, while the mask covering an outer portion 202 of the shaded area 202,204 remains in place.

Figure 3:
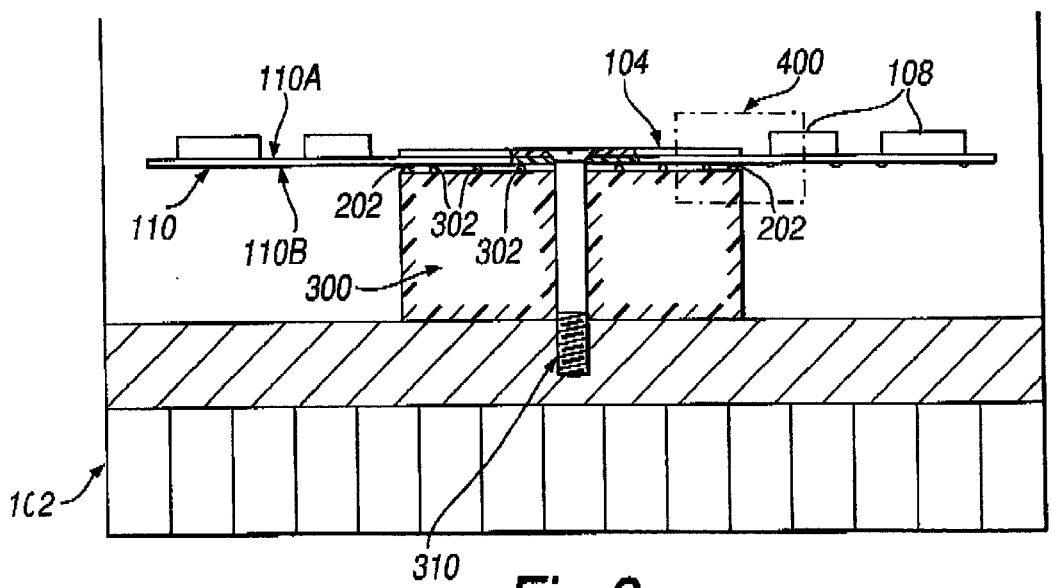
FIG. 3 shows a cross-section through the inverter shown in FIG. 1.
Figure 4:
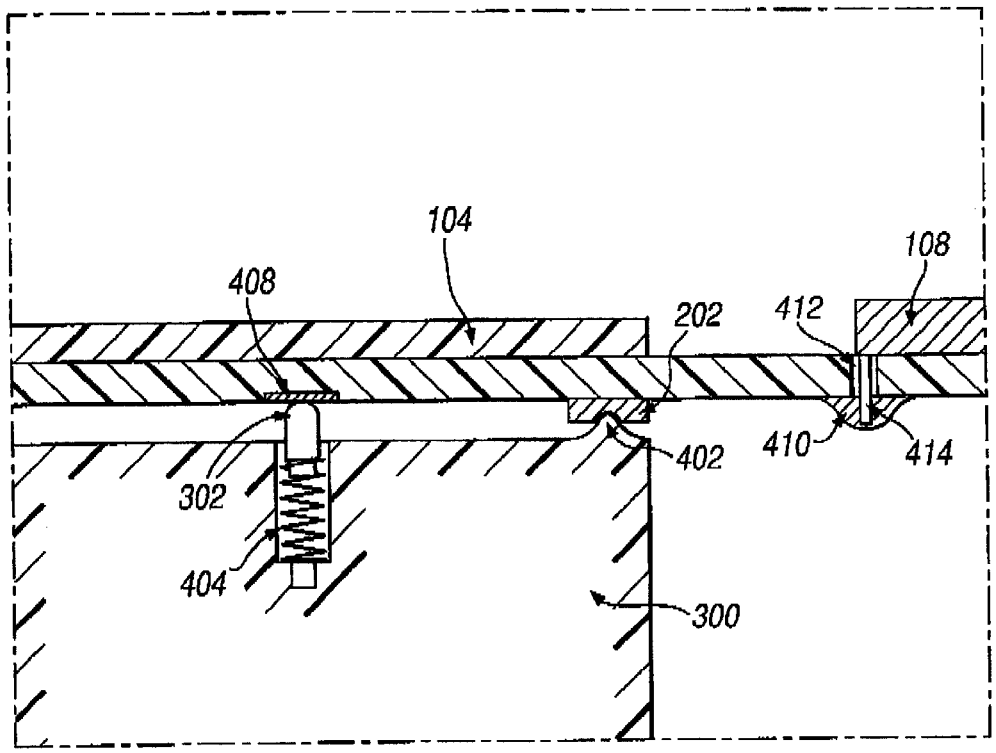
FIG. 4 shows a portion of the cross-section in FIG. 3 in more detail.

FIG. 3 shows the inverter of FIG. 1 in a sectioned view so that the inverter electronics can be seen. FIG. 4 shows an enlarged portion 400 of FIG. 3. It should be noted that the first side 110A of the PCB 110 appears above the second side 110B of the PCB 110 in both Figures.

As illustrated in both FIGS. 3 and 4, conventional components 108, having conducting pins 414, are arranged on the first side of the PCB 110. The conducting pins 414 extend below the surface of the second side of the PCB 110 through port holes 412. When the second side of the PCB 110 is exposed to solder, solder 410 adheres to the exposed portions of the conducting pins 414 and, once solid, holds the components 108 in place.

A MiniSKiiP power module 300 is mounted on the second side of the PCB 110 (the underside in FIG. 1). The MiniSKiiP Module 300 is attached to the PCB 110 by compression: contacts 408 are provided on the underside of the PCB 110 which engage with conductor legs 302 of the MiniSKiiP Module 300. The conductor legs 302 are arranged to make optimal electrical contact with the contacts 408 under a predetermined compression. In the embodiment shown in FIG. 4, the conductor legs 302 have spring portions 404 and are thus resiliently deformable.

The MiniSKiiP power module 300 is sandwiched between the heatsink cover 102 and the PCB 110, with a screw 310 through the middle to provide the predetermined compression between the PCB 110 and the MiniSKiiP Module 300. The heat sink cover 102 is filled with potting compound (not shown for clarity), leaving only the connections and taller components poking through.

The MiniSKiiP Module 300 is provided with a ridge 402 at the perimeter of the surface adjacent to the PCB 110. It has been found that the outer portion 202 of the peelable mask can be arranged to coincide with the ridge 402 on the MiniSKiiP Module 300 so that the outer portion 202 of the mask deforms around the MiniSKiiP Module 300 to form a seal through which no potting compound can pass.

Thus the peelable mask of the present invention not only prevents solder pick-up but also acts to seal the MiniSKiiP power module to the PCB against potting compound incursion (again the potting compound is not shown for clarity).

By using the peelable mask for its conventional purpose over the whole area 202,204 to which the MiniSKiiP Module 300 attaches, solder can be applied to conventional components 108 on the second side 110B of the printed board 110 using a flow solder machine while the MiniSKiiP Module contact areas 408 remain protected from solder pick up.

In a preferred embodiment of the invention as illustrated in FIG. 2, the peelable mask can be arranged to cover two distinct parts of the PCB 110, an outer masked portion and an inner masked portion. After flow soldering, the mask covering the inner portion 204 can be removed to leave the outer portion 202 masked. The outer portion 202 is then used as a mechanical seal for the MiniSKiiP Module 300.

Furthermore, it has been observed that a typical peelable mask is approximately 50 microns thick and can be compressed to approximately half that thickness. As a result, the presence of the outer portion 202 does not affect the contact pressure between the MiniSKiiP Module and the PCB, while it does prevent the ingress of foreign matter, for example potting compound between the MiniSKiiP Module and the PCB. Conventional gaskets are thicker, being of the order of 0.5 mm, and substantially affect the distribution of compression which can be applied to the conductor legs of the MicroSKiiP Module.

What is claimed is:

1. A method for assembling an electrical device having a printed circuit board (110), the printed circuit board (110) having a first side (110A) and a second side (110A) and being provided with slots (412) for receiving conducting legs (414) of at least one electrical component (108), the method including the steps of:
   a) masking an area (202,204) of the second side (110B) of the printed circuit board (110) with a solder-repellent mask, the masked area (202,204) comprising a first portion (204) and a second portion (202);
   b) disposing said at least one electrical component (108) on the first side (110A) of the printed circuit board (110) with the conducting legs (414) extending through the slots (412) from the first side (110A) to the second side (110B);
   c) fixing said at least one electrical component (108) in place by exposing the second side (110B) to solder (410) and allowing the solder (410) to solidify;
the method characterised by further including:
   d) removing the solder-repellent mask from the first portion (204) to expose at least one contact (408) while leaving the solder-repellent mask in place over the second portion (202); and
   e) disposing a further electrical component (300) directly against the second side (110B), a lower surface of the further electrical component (300) lying adjacent to the second side (110B), the second portion (202) corresponding to at least those points of the masked area (202,204) at which the lower surface of the further electrical component (300) touch the masked area (202,204), the second portion (202) thereby forming a seal between the further electrical component (300) and the second side (110B) of the printed circuit board (110).

2. A method according to claim 1, further including the step of:
   f) submerging the electrical device in a potting compound, the second portion (202) preventing the ingress of potting compound between the further electrical component (300) and the printed circuit board (110).

3. A method according to claim 1, wherein the masked area (202,204) is a single contiguous area.

4. A method according to claim 3, wherein the second portion (202) is an outer portion of the masked area (202, 204) and the first portion (204) is an inner portion of the masked area (202,204), all points on the periphery of the masked area (202,204) lying within the second portion (202).

5. A method according to claim 1, wherein the exposure to solder in step c) is achieved through a flow solder technique.

6. A method according to claim 1, wherein the further electrical component (300) is an inverter module.

* * * * *